(12) United States Patent
Boerstler et al.

(10) Patent No.: US 6,529,082 B1
(45) Date of Patent: Mar. 4, 2003

(54) DUAL MODE CHARGE PUMP

(75) Inventors: David W. Boerstler, Round Rock, TX (US); Gary D. Carpenter, Pflugerville, TX (US); Hung C. Ngo, Austin, TX (US); Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/975,187

(22) Filed: Oct. 11, 2001

(51) Int. Cl.[7] .............................. H03L 7/00; H03L 7/089
(52) U.S. Cl. .............................. 331/17; 331/8; 327/111; 327/157
(58) Field of Search .............................. 331/1 A, 8, 17, 331/18, 25; 327/108–112, 156–159

(56) References Cited

U.S. PATENT DOCUMENTS

| | | | |
|---|---|---|---|
| 5,477,193 A | * 12/1995 | Burchfield | 331/8 |
| 5,677,648 A | * 10/1997 | Jones | 331/17 |
| 6,298,448 B1 | 10/2001 | Shaffer et al. | 713/322 |

* cited by examiner

Primary Examiner—David C. Mis

(74) Attorney, Agent, or Firm—Richard F. Frankeny; Winstead Sechrest & Minick P.C.; Casimer K. Salys

(57) ABSTRACT

A charge pump has two charge pump nodes. The first charge pump node has a first current source (CS) with a source terminal connected to a positive supply voltage and an output terminal connected to the first charge pump node with a P channel metal oxide silicon transistor (PFET) controlled by a first control signal. The first charge pump node is also connected to a second CS with a source terminal connected to the ground supply voltage and an output terminal connected to the second CS with an NFET controlled by a second control signal. The second charge pump node has a third CS with a source terminal connected to the positive supply voltage and an output terminal connected to the second charge pump node with a PFET controlled by a third control signal. The second charge pump node is also connected to a fourth CS with a source terminal connected to the ground supply voltage and an output terminal connected to the second CS with an NFET controlled by a fourth control signal. A first bi-directional transfer gate is coupled between the output nodes of the first and third CSs and is controlled by a Mode control signal and a second bi-directional transfer gate is coupled between the output nodes of the second and fourth CSs and is also controlled by the Mode control signal. States of the control signals allow a dual mode where either a first or second current level may be delivered into or out of components coupled to the first and second charge pump nodes.

19 Claims, 5 Drawing Sheets

DUAL MODE CHARGE PUMP

CROSS REFERENCE TO RELATED APPLICATION

The present invention is related to the following U.S. Patent Applications, which are incorporated by reference:

Ser. No. 09/974,990 entitled "Glitchless Clock Selector" filed concurrently herewith, Ser. No. 09/974,969 entitled "Multi-mode VCO" filed concurrently herewith, Ser. No. 09/974,987 entitled "Clock Divider With Bypass" filed concurrently herewith, and Ser. No. 09/974,985 entitled "Dynamically Scaled Low Voltage Clock Generator System" filed concurrently herewith.

TECHNICAL FIELD

The present invention relates in general to circuits for generating and controlling computer clocks and in particular to circuits used to convert digital signals to an analog signal by integrating a current in a capacitor.

BACKGROUND INFORMATION

Phase-locked loops (PLL's) have been widely used in high-speed communication systems because PLL's efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower frequency reference frequency from a stable oscillator to generate system clock frequencies. A PLL also allows changing the system clock frequency without changing the reference frequency.

The phase/frequency detector (PFD) in a phase lock loop generates an error signal when the phase of the reference clock (RCLK) leads or lags the feedback clock (FBCLK) regardless of whether the phase difference is due to simply phase differences or phase and frequency differences. Because PLLs typically generate digital signals, the phase error signals switch between two logic states and the time the phase error signals remain at a logic level is indicative of relative lead or lag phase error. Typically, two signals are generated UP (when the phase error is a lag) and DOWN (when the phase error is a lead). These digital phase error signals are then applied to a circuit that is able to generate an analog control voltage for a voltage-controlled oscillator (VCO) to control the frequency of the VCO's output. This VCO output is then fed back through a feedback circuit as the FBCLK.

A charge pump circuit is used in many PLLs to generate the analog control voltage for the VCO. The charge pump uses charge and discharge current sources to integrate the digital phase error signals to generate the analog control voltage. In a scalable system employing a PLL that may be operated in multiple distinct frequency ranges, it is desirable to have a charge pump that also has selectable operation ranges by modifying the current levels of the current sources. If the current ranges are sufficiently different, this may dictate two distinct current sources with different device sizes.

There is, therefore, a need for a dual mode charge pump circuit that allows for the selection of two operation ranges without resorting to separate current sources with different device sizes. This will conserve chip area and simplify circuit design.

SUMMARY OF THE INVENTION

A charge pump has two current sources with a positive source voltage and two current "sinks" (current sources with a ground source voltage). A first current source is connected to a first charge pump node with a first electronic switch controlled by a first control signal and a first current sink is connected to the first charge pump node with a second electronic switch controlled by a second control signal. Likewise, a second current source is connected to a second charge pump node with a third electronic switch controlled by a third control signal and a second current sink is connected to the second charge pump node with a fourth electronic switch controlled by a fourth control signal. The outputs of the first and second current sources are connected with a first bi-directional electronic switch controlled by a mode control signal and the outputs of the first and second current sinks are connected with a second bi-directional electronic switch controlled by the mode control signal. The first and fourth control signals are logic complements and mutually exclusive with the second and third control signals which are also logic complements. The mode control signal is set to a logic one state to generate a first current level and a logic zero to set a second current level for components coupled from said first and second charge pump nodes to the ground source voltage.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
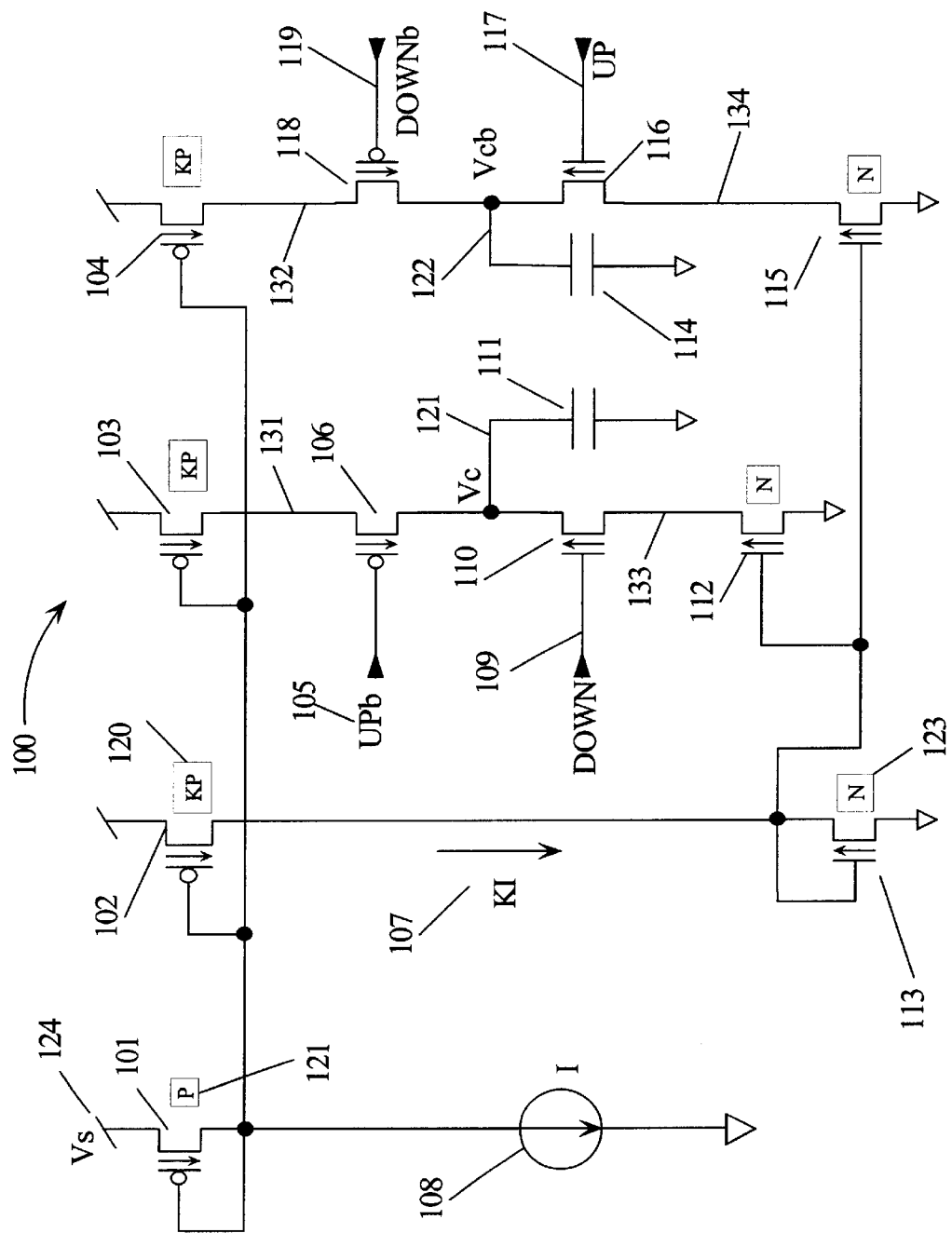
FIG. 1 is a circuit for a prior art charge pump circuit.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following detailed descriptions, a logic zero is a low or zero voltage and a logic one is a high or a plus supply voltage to simplify explanation of embodiments of the present invention.

FIG. 1 is a circuit diagram of a differential charge pump circuit (CP) 100. A charge pump maybe used to generate a differential voltage for a circuit where differential signals provide better performance that a single ended voltage. For example, some voltage controlled oscillator circuits, employed in phase lock loops, use differential signals to improve noise rejection and thus use differential charge pumps to generate differential control voltages.

In FIG. 1, current source (CS) 108 has a current level of "I". CS 108 "sinks" the current level I through P channel field effect transistor (PFET) 101. PFET 101 has a size designated by "P" 121. This designation is used to discuss the relative size of FET devices. PFET 101 has its drain and gate terminals connected. In this manner, the gate to source voltage of PFET 101 adjusts to a level necessary for it to pass the current level I as set by CS 108. PFET 102 has a size designation KP 120. In this notation, PFET 102 has a size K times the size of PFET 101. PFET 101 and PFET 102 are made on the same process and are matched and as such would produce the same current for the same applied gate to source voltage except for the fact that PFET 102 is K times the size of PFET 101. The size indication refers to the relative channel width to length ratio. Since the gate to source voltage of PFET 101 is applied across the gate to source of scaled device PFET 102, PFET 102 will generate a current K times that of PFET 101, in this case the current of PFET 102 has a value KI. PFET 102 is said to be a "current mirror" current source for the current in PFET 101. The current KI from current source PFET 102 drives NFET 113 which is connected so that its gate to source voltage attains a level necessary for NFET 113 to "sink" the current from current source PFET 102. PFET 101 "mirrors" its current level I to PFETs 102, 103 and 104 as KI. Likewise, NFET 113 mirrors its current level KI to NFETs 112 and 115 as current level KI. PFET 106 and NFET 110 are gated by logic signals UPb 105 and DOWN 109 and are used to connect PFET 103 and NFET 112 to charge pump node (CPN) 121. CPN 121 generates a voltage Vc 121 which depends on which of FETs 106 or 110 are gated ON and what component(s) is connected from CPN 121 to ground. By adding a capacitor (C) 111 from the common drain connection of PFET 106 and NFET 110 to ground, an integrating node is formed. When a capacitor (e.g., C 111) is coupled to CPN 121, Vc 121 is determined by the integral of the current feeding C 111 since the voltage across a capacitor is the integral of the current flowing through the capacitor. In this case, the capacitor current level is either +KI or −KI depending on which one of PFET 106 and NFET 110 is gated ON. If CP 100 is used with a phase lock loop (e.g., PLL 500), then the logic voltages UPb 105 and DOWN 109 would be derived from the phase/frequency detector (e.g., PFD 501) and the voltage Vc 121 would attain a voltage level proportional to a phase error. Current source device PFET 104 and NFET 115 are likewise coupled to charge pump node 122 via switches PFET 118 and NFET 116 which are turned ON and OFF with logic signals DOWNb 119 and UP 117 respectively. Capacitor 114 is coupled between the common drain terminals of PFET 118 and NFET 116 and ground. Voltage Vcb 122 is generated by the integral of the current through capacitor 114. Logic signals DOWN 109 and DOWNb 119 are complementary logic signals. Likewise logic signals UP 117 and UPb 105 are complementary logic signals. Charge pump circuit 100 generates voltages Vc 121 and Vcb 122 such that these two signals move in opposite directions in response to logic signals UP 117, UPb 105, DOWN 109 and DOWNb 119 thus generating a differential voltage between the charge pump nodes 121 and 122. The rate of change of the voltages is dependent on the level of the current source currents (e.g., KI) and the value of capacitors C 111 and C 114. If a different response is desired for the voltages Vc 121 and Vcb 122, additional current sources would need to be employed or different capacitors would need to be switched into the circuit. The charge pump 100 has only one operating range.

Figure 2A:
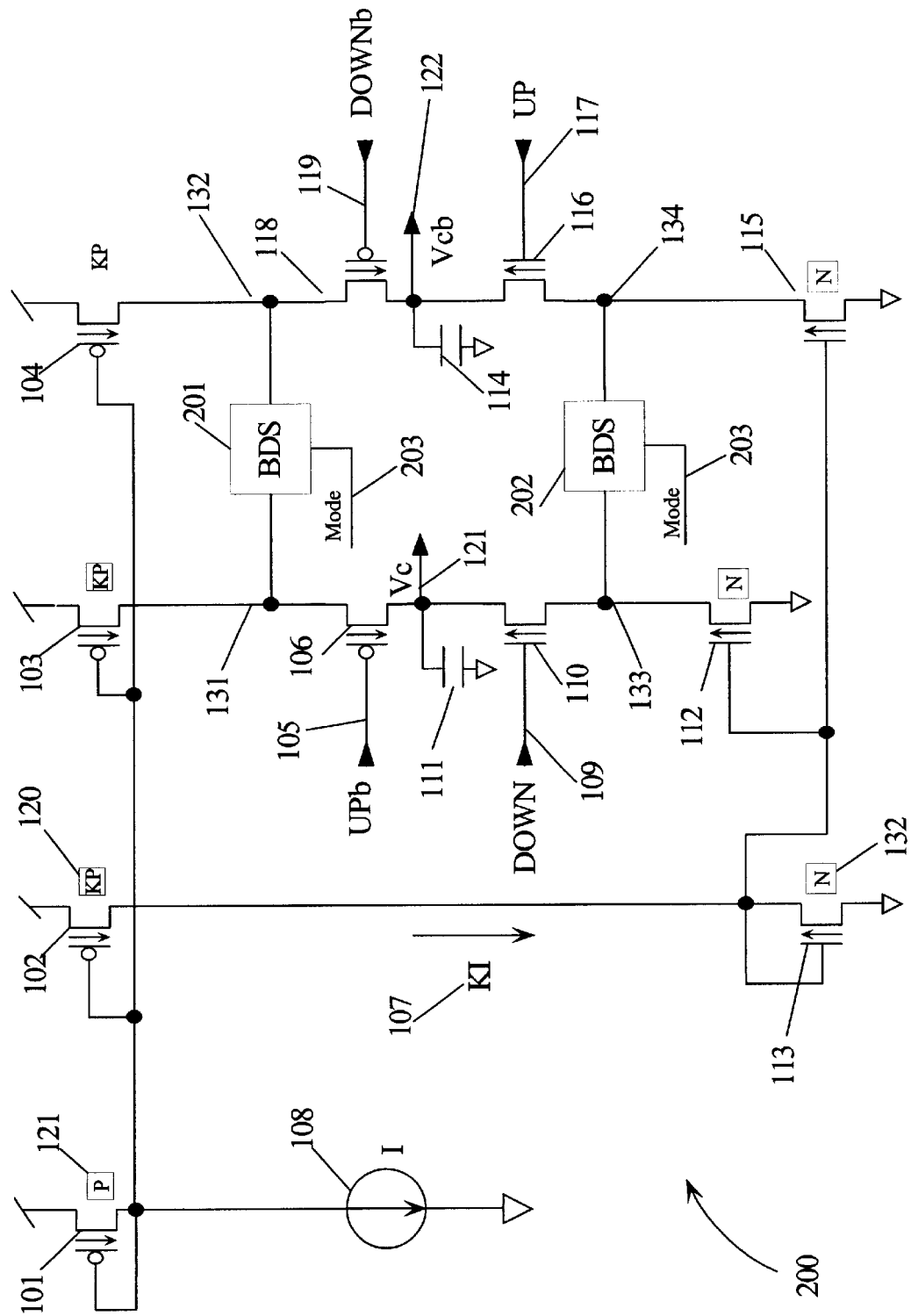
FIG. 2A is a circuit diagram for a dual mode charge pump circuit according to embodiments of the present invention.

FIG. 2A is a circuit diagram of a charge pump 200 which has two current ranges and operates according to embodiments of the present invention. Charge pump 200 is configured by adding bi-directional electronic switches (BDS) 201 and BDS 202 to the circuitry of charge pump 100. BDS201 is coupled between nodes 131 and 132, and BDS 202 is coupled between nodes 133 and 134. BDS 201 and BDS 202 are gated ON and OFF concurrently with Mode control signal 203.

UPb 105 and UP 117 are complementary logic signals and are mutually exclusive with logic signals DOWN 109 and DOWNb 119 which are also complementary logic signals. Because the signals are mutually exclusive, UPb 105 and DOWNb 119 do not concurrently have the same logic state. Likewise, DOWN 109 and UP 117 are mutually exclusive logic signals. If BDS 201 and BDS 203 are gated OFF, charge pump 200 operates as charge pump 100. However, when BDS 201 and BDS 202 are gated ON, then the states of UPb 105, DOWNb 19, DOWN 109, and UP 117 determine current flow into and out of charge pump nodes 121 and 122. If BDS 201 and BDS 202 are gated ON and UPb 105 is a logic zero turning ON PFET 106, then NFET 116 is also gated ON by UP 117. The mutual exclusivity of the logic control signals as discussed assures that PFET 118 and NFET 110 are gated OFF at this time. In this state, BDS 201 conducts the current KI of current source PFET 104 to node 131 where it sums with the current KI of current source PFET 103. Since switch PFET 106 is gated ON, the summed current level 2KI is delivered to charge pump node 121. Since NFET 110 must be gate OFF by DOWN 109, the current 2KI flows in C 111. C 111 integrates the current and generates voltage Vc 121 at node 121. BDS 202 is also gated ON by Mode signal 203 and conducts the current KI of current "sink" NFET 112 to node 134 to sum with the current KI of current sink NFET 115. These currents sum to form a current sink of 2KI at node 134. Since UP 117 is a logic one (complement of UPb 105), switch NFET 116 is ON coupling the current 2KI out of charge pump node 122. Since switch PFET 118 is gated OFF, the current discharges C 114 (negative integral) generating voltage Vcb 122. When BDS 201 and BDS 202 are gated OFF, only the current of one current source FET, either PFET 103 or NFET 112 is available at charge pump node 121. Likewise, when BDS 201 and BDS 202 are gated OFF only the current of one current source FET, either PFET 104 or NFET 115 is available at charge pump node 122. By adding BDS 201 and BDS 202, charge pump 200 becomes dual mode with two logic selectable current ranges.

Figure 2B:
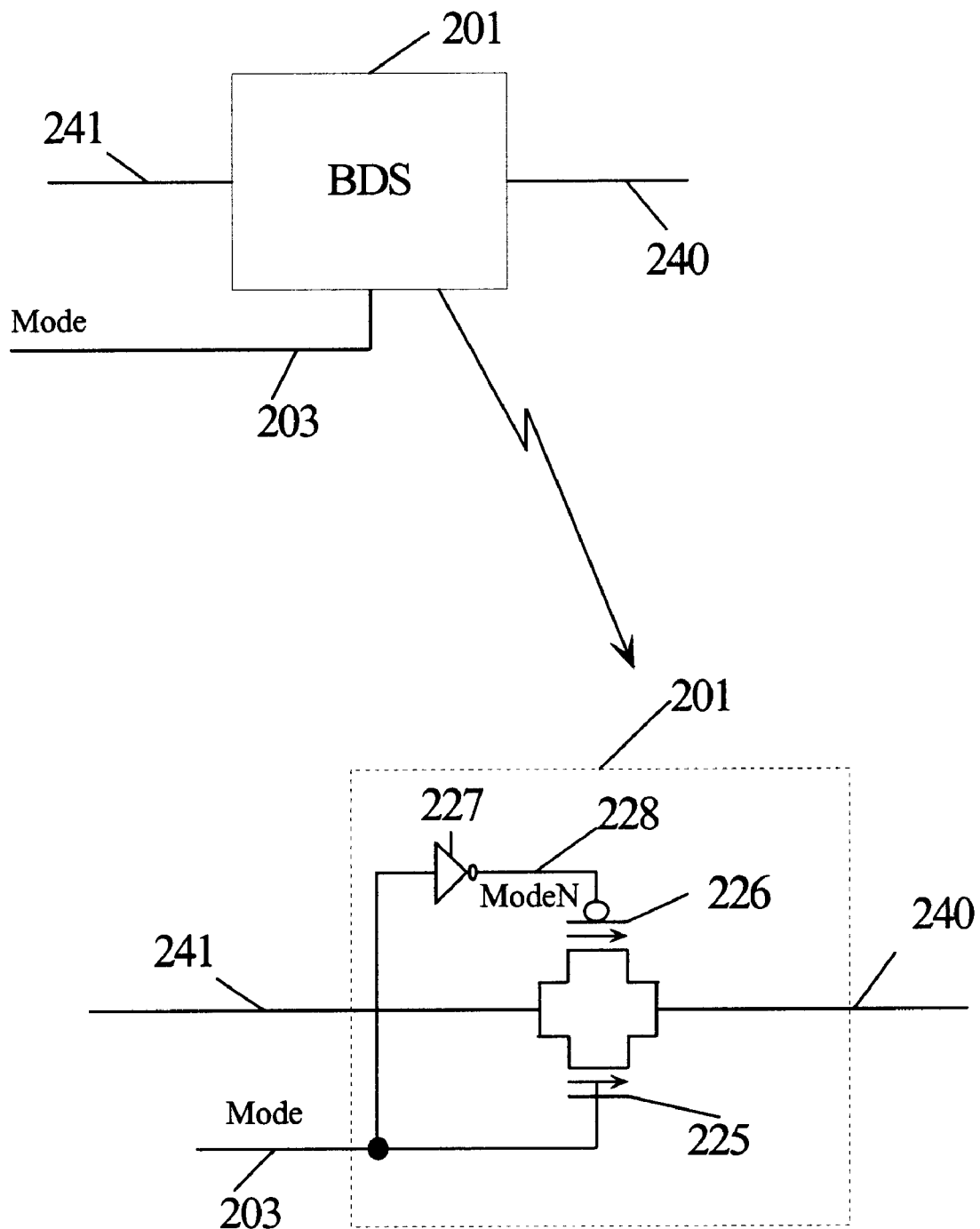
FIG. 2B is a detailed circuit diagram of a bi-directional electronic switch usable in embodiments of the present invention.

FIG. 2B is a circuit diagram showing a detailed exemplary circuit of a BDS (e.g., BDS 201 and BDS 202). Other BDS circuits are possible and are within the scope of the present invention. Exemplary BDS 201 has input 241 and output 240 (arbitrary designations since the switch is bi-directional) and a control signal Mode 203. BDS 201 is a transfer gate circuit configuration comprising PFET 226 and NFET 225. PFET 226 provides conduction in one direction and NFET 225 provides conduction in the opposite direction. Mode 203 is inverted by inverter 227 to provide the complementary control for NFET 225. This assures that NFET 225 and PFET 226 are concurrently gated ON or OFF by Mode signal 203. Inverter 227 may be removed from a particular BDS and a common signals, Mode 203 and ModeN signal 228, may be coupled to BDS 201 and BDS 202 in charge pump 200. Embodiments of the present invention use the diagram of BDS 201 and BDS 202 with one control signal Mode 203 to simplify the circuitry, however, it is understood that a single inverter, like inverter 227, may be used with Mode 203 to generate a complement signal ModeN 228 which may be coupled to BDS circuits and still be within the scope of the present invention.

Charge pump 200 is used such that UPb 105, DOWNb 119 and complements UP 117 and DOWN 109 are never at the same time logic states as discussed above. For example, in a PFD of a PLL the phase error is never leading and lagging at the same time. If logic signals UPb 105, UP 117, DOWN 109, and DOWNb 119 are generated from phase error signals, then UPb 105 and DOWNb 119 would never be at a logic zero at the same time. Likewise UP 117 and DOWN 109 would never be at a logic one at the same time. In these types of applications, BDS 201 and BDS 202 may be gated ON and OFF to create an additional high current operation range for the charge pump without adding additional current sources or larger devices.

Figure 3:
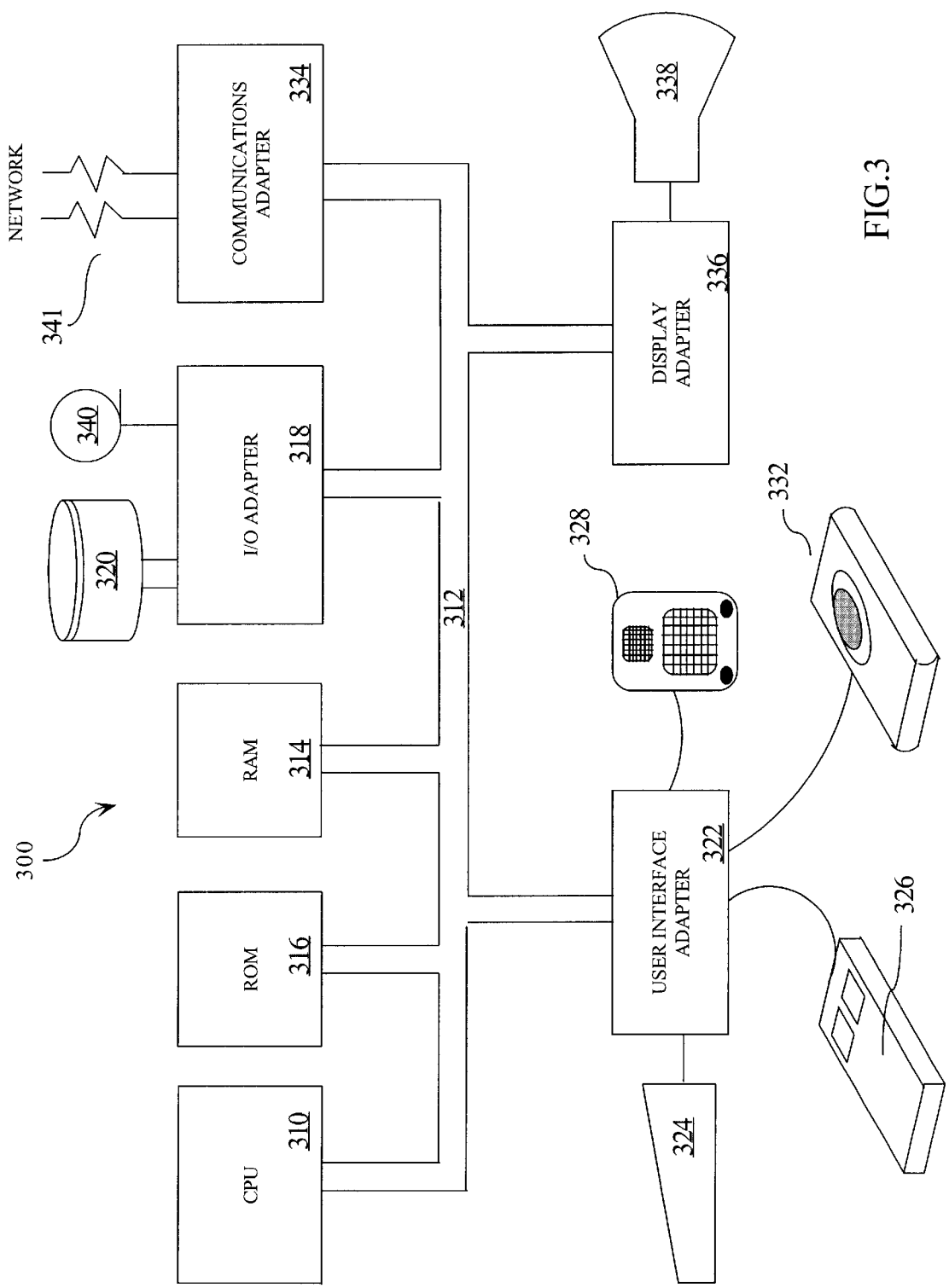
FIG. 3 is a block diagram of data processing system which is configured with a processor and circuits that may contain a PLL utilizing a charge pump circuit according to embodiments of the present invention.

FIG. 3 is a high level functional block diagram of a representative data processing system 300 suitable for practicing the principles of the present invention. Data processing system 300, includes a central processing system (CPU) 310 operating in conjunction with a system bus 312. System bus 312 operates in accordance with a standard bus protocol, such that as the ISA protocol, compatible with CPU 310. CPU 310 operates in conjunction with electronically erasable programmable read-only memory (EEPROM) 316 and random access memory (RAM) 314. Among other things, EEPROM 316 supports storage the Basic Input Output System (BIOS) data and recovery code. RAM 314 includes, DRAM (Dynamic Random Access Memory) system memory and SRAM (Static Random Access Memory) external cache. I/O Adapter 318 allows for an interconnection between the devices on system bus 312 and external peripherals, such as mass storage devices (e.g., a hard drive, floppy drive or CD/ROM drive), or a printer 340. A peripheral device 320 is, for example, coupled to a peripheral control interface (PCI) bus, and I/O adapter 318 therefore maybe a PCI bus bridge. User interface adapter 322 couples various user input devices, such as a keyboard 324, mouse 326, touch pad 332 or speaker 328 to the processing devices on bus 312. Display 338 which maybe, for example, a cathode ray tube (CRT), liquid crystal display (LCD) or similar conventional display units. Display adapter 336 may include, among other things, a conventional display controller and frame buffer memory. Data processing system 300 may be selectively coupled to a computer or telecommunications network 341 through communications adapter 334. Communications adapter 334 may include, for example, a modem for connection to a telecom network and/or hardware and software for connecting to a computer network such as a local area network (LAN) or a wide area network (WAN). CPU 310 and other components of data processing system 300 may contain circuitry for generating clocks which employ a charge pump circuit according to embodiments of the present invention to generate a logic controlled operation ranges.

Figure 4:
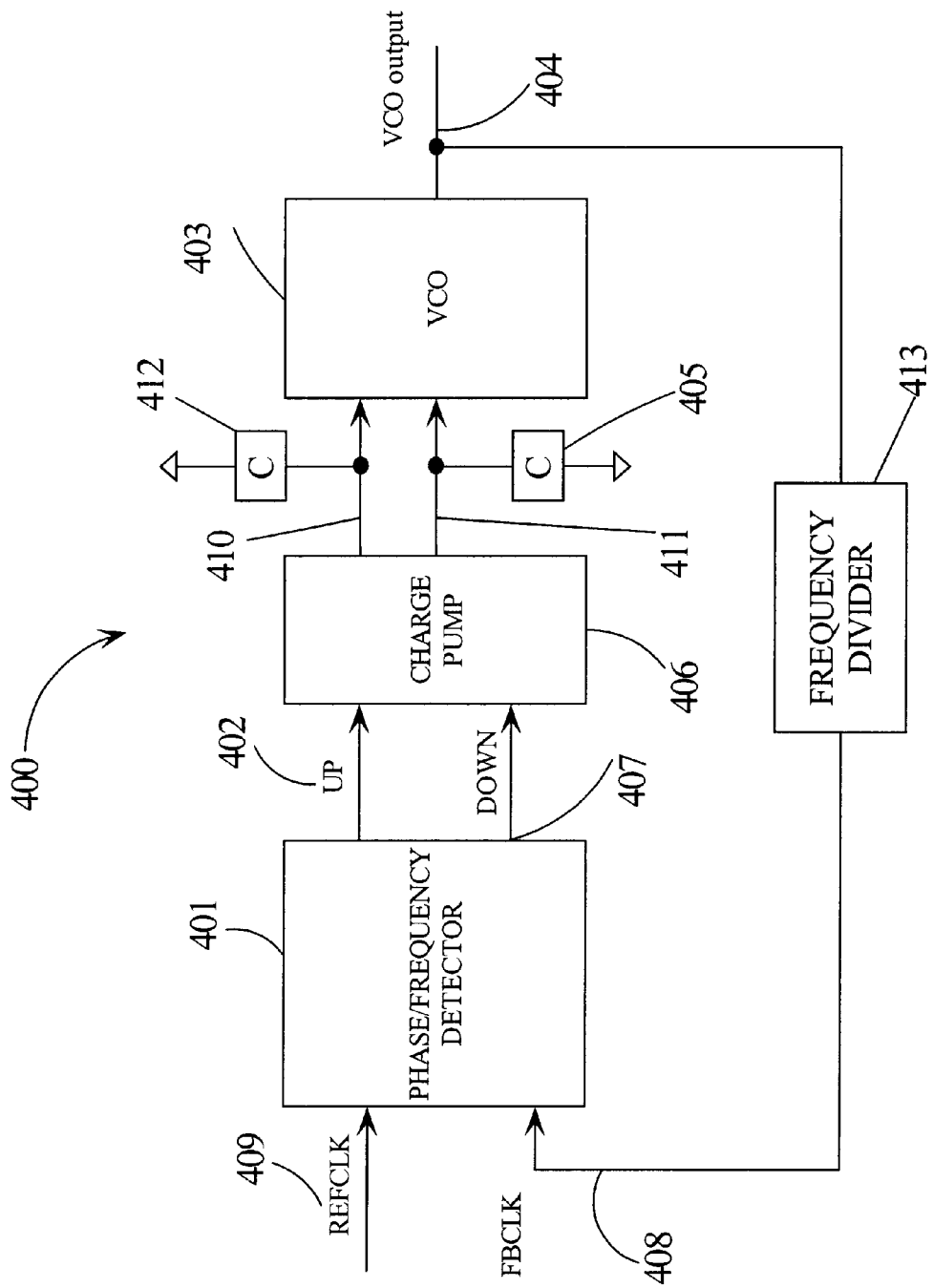
FIG. 4 is a flow diagram of method steps in embodiments of the present invention.

FIG. 4 is a block diagram of a representative phase lock loop circuit 400 suitable for practicing the principles of the present invention. Reference clock (RCLK) 409 and feedback clock (FBCLK) 408 are compared in phase/frequency detector (PFD) 401 generating UP signal 402 and DOWN signal 407 which are applied as control signals to charge pump 406. UP signal 402 and DOWN signal 407 are used to control current sources in charge pump 406. Charge pump 406 has charge pump nodes 410 and 411. Capacitor 412 is coupled between charge pump node 410 and ground and capacitor 405 is coupled between charge pump node 411 and ground. UP signal 402 and DOWN 407 are generated in response to a lead or lag phase difference between RCLK 409 and FBCLK 408. Since RCLK 409 and FBCLK 408 cannot concurrently have a lead and a lag phase error, UP signal 402 and DOWN 407 are mutually exclusive signals. VCO output 404 is frequency divided by frequency divider 413 generating FBCLK 408. The differential signal between charge pump nodes 410 and 411 is used to control the frequency of VCO 403. Charge pump 406 may be configured according to embodiments of the present invention to have a dual mode of operation.

The present invention and its advantages have been described in detail, it should be understood that various changes, substitutions and alterations can be made herein without departing from the spirit and scope of the invention as defined by the appended claims.

What is claimed is:

1. A charge pump circuit comprising:
   a first current source having a first input node coupled to a first source voltage and a first output node,
   a first electronic switch controlled by a first control signal, said first electronic switch having a first switch terminal coupled to said first output node and a second switch terminal coupled to a first charge pump node;
   a second current source having a second input node coupled to said first source voltage and a second output node;
   a second electronic switch controlled by a second control signal, said second electronic switch having a third switch terminal coupled to said second output node and a fourth switch terminal coupled to a second charge pump node; and
   a first bi-directional electronic switch having a fifth switch terminal coupled to said first output node and a sixth switch terminal coupled to said second output node, said first bi-directional electronic switch gated ON and OFF in response to a third control signal, wherein said first and said second charge pump nodes selectively receive a first current level and a second current level in response to said first control signal, said second control signal and said third control signal.

2. The charge pump circuit of claim 1 further comprising:
a third current source having a third input node coupled to a second source voltage and a third output node;
a third electronic switch controlled by a fourth control signal, said third electronic switch having a seventh switch terminal coupled to said third output node, and an eighth switch terminal coupled to said second switch terminal;
a fourth current source having a fourth input node coupled to said second source voltage and a fourth output node;
a fourth electronic switch controlled by a fifth control signal, said fourth electronic switch having a ninth switch terminal coupled to said fourth output node and a tenth switch terminal coupled to said fourth switch terminal; and
a second bi-directional electronic switch having a eleventh switch terminal coupled to said third output node and a twelfth switch terminal coupled to said fourth output node, said second bi-directional electronic switch gated ON and OFF in response to said third control signal, wherein said first and said second charge pump nodes selectively receive said first current level and said second current level in response to said third control signal, said fourth control signal and said fifth control signal.

3. The charge pump circuit of claim 1, wherein said first current source and said second current source are set to said first current level.

4. The charge pump circuit of claim 2, wherein said second current source and said third current source are set to said first current level.

5. The charge pump circuit of claim 1, wherein said first bi-directional electronic switch is a transfer gate circuit comprising a parallel connected NFET and PFET, said NFET and PFET having a common source terminal coupled to said fifth switch terminal, a common drain terminal coupled to said sixth switch terminal, and a common control terminal said common gate terminal coupled to said third control signal.

6. The charge pump circuit of claim 1, wherein said first electronic switch comprises a PFET, a gate terminal of said PFET coupled to said first control signal, a drain terminal of said PFET coupled to said second switch terminal, and a source terminal of said PFET coupled to said first switch terminal.

7. The charge pump circuit of claim 1, wherein said second electronic switch comprises a PFET, a gate terminal of said PFET coupled to said second control signal, a drain terminal of said PFET coupled to said fourth switch terminal, and a source terminal of said PFET coupled to said third switch terminal.

8. The charge pump circuit of claim 2, wherein said second bi-directional electronic switch is a transfer gate comprising a parallel connected NFET and PFET, said NFET and PFET having a common source terminal coupled to said eleventh switch terminal, common drain terminal coupled to said twelfth switch terminal, and a common control terminal coupled to said third control signal.

9. The charge pump circuit of claim 2, wherein said third electronic switch comprises a NFET, a gate terminal of said NFET coupled to said fourth control signal, a source terminal of said NFET coupled to said seventh switch terminal, and a drain terminal of said NFET coupled to said eighth switch terminal.

10. The charge pump circuit of claim 2, wherein said fourth electronic switch comprises a NFET, a gate terminal of said fourth electronic switch coupled to said fifth control signal, a drain terminal of said NFET coupled to tenth switch terminal, and a source terminal of said NFET coupled to said ninth switch terminal.

11. The charge pump circuit of claim 2, wherein one logic state of said third control signal sets a first charge pump current level and the other logic state of said third control signal sets a second charge pump current level.

12. The charge pump circuit of claim 2, wherein said first and said fifth control signals are complement logic signals and said second and said fourth control signals are complement logic signals mutually exclusive with said first and fifth control signals.

13. A data processing system comprising:
a central processor unit (CPU), operable to generate a clock signal with a phase lock loop (PLL) clock generator using a charge pump circuit generating a differential voltage between a first charge pump node and a second charge pump node by selectively coupling complementary current sources to said first charge pump node and said second charge pump node, having a first bi-directional electronic switch coupled between a first output node of a first current source coupled to said first charge pump node and a second output node of a second current source coupled to second charge pump node, said first bi-directional electronic switch controlled by a first control voltage, wherein said first and second charge pump nodes selectively receive a first and second current level in response to said first control voltage;
a random access memory (RAM);
a read only memory (ROM);
a communications adapter coupled to a communication network;
an I/O adapter; and
a bus system coupling said CPU to said ROM, said communications adapter, said I/O adapter, and said RAM.

14. The data processing system of claim 13 further comprising a second bi-directional electronic switch coupled between a third output node of a third current source coupled to said first charge pump node and a fourth output node of a fourth current source coupled to second charge pump node, said second bi-directional electronic switch controlled by said first control voltage, wherein said first and second charge pump nodes selectively receive a third and a fourth current level in response to said first control voltage.

15. A phase lock loop (PLL) circuit comprising:
a charge pump circuit generating a differential voltage between a first charge pump node and a second charge pump node by selectively coupling complementary current sources to said first charge pump node and said second charge pump node;
a first bi-directional electronic switch coupled between a first output node of a first current source coupled to said first charge pump node and a second output node of a second current source coupled to second charge pump node, said first bi-directional electronic switch controlled by a first control voltage, wherein said first and second charge pump nodes selectively receive a first current level and second current level in response to said first control voltage.

16. The PLL circuit of claim 15 further comprising a second bi-directional electronic switch coupled between a third output node of a third current source coupled to said first charge pump node and a fourth output node of a fourth current source coupled to second charge pump node, said second bi-directional electronic switch controlled by said first control voltage, wherein said first and second charge pump nodes selectively receive a third current level and fourth current level in response to said first control voltage.

17. The PLL circuit of claim 16 further comprising a first capacitor and a second capacitor coupled to said first and said second charge pump nodes, respectively;

a phase/frequency comparator receiving a reference clock signal and a feedback clock signal and generating signals for controlling electronic switches used to selectively couple said first and second current sources to said first and second charge pump nodes;

a voltage controlled oscillator (VCO) coupled to said first charge pump node and said second charge pump node and generating a VCO output signal; and a signal frequency divider receiving said VCO output signal and generating said feedback clock signal.

18. A charge pump circuit generating a differential voltage between a first charge pump node and a second charge pump node by selectively coupling complementary current sources to said first charge pump node and said second charge pump node, comprising:

a first bi-directional electronic switch coupled between an first output node of a first current source coupled to said first charge pump node and a second output node of a second current source coupled to second charge pump node, said first bi-directional electronic switch controlled by a first control voltage, wherein said first and second charge pump nodes selectively receive a first current level and a second current level in response to said first control voltage.

19. The charge pump circuit of claim 18 further comprising a second bi-directional electronic switch coupled between a third output node of a third current source coupled to said first charge pump node and a fourth output node of a fourth current source coupled to second charge pump node, said second bi-directional electronic switch controlled by said first control voltage, wherein said first and second charge pump nodes selectively receive a third current level and a fourth current level in response to said first control voltage.

* * * * *